(12) United States Patent
Kakoschke

(10) Patent No.: US 6,218,699 B1
(45) Date of Patent: Apr. 17, 2001

(54) SEMICONDUCTOR COMPONENT WITH ADJUSTABLE CURRENT AMPLIFICATION BASED ON A TUNNEL-CURRENT-CONTROLLED AVALANCHE BREAKDOWN

(75) Inventor: Ronald Kakoschke, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/169,773

(22) Filed: Oct. 9, 1998

Related U.S. Application Data

(63) Continuation of application No. PCT/DE97/00595, filed on Mar. 24, 1997.

(30) Foreign Application Priority Data

Apr. 9, 1996 (DE) .............................................. 196 14 010

(51) Int. Cl.⁷ .................................................. H01L 29/788
(52) U.S. Cl. .......................................... 257/321; 257/372
(58) Field of Search .................................. 257/321, 372; 438/263, 264

(56) References Cited

U.S. PATENT DOCUMENTS

| | | | |
|---|---|---|---|
| 4,375,087 | * 2/1983 | Wanlass | 365/218 |
| 4,953,928 | 9/1990 | Anderson et al. | |
| 4,969,019 | 11/1990 | Banerjee | |
| 5,273,923 | * 12/1993 | Chang et al. | 257/321 |

FOREIGN PATENT DOCUMENTS

| | | |
|---|---|---|
| 1 803 035 | 5/1969 | (DE) . |
| 44 13 822 A1 | 9/1995 | (DE) . |

OTHER PUBLICATIONS

"An Improved Model for the Erase Operation of Flotox EEPROM Cell" (Chang et al.), Solid State Electronics, vol. 35, No. 10, 1992, pp. 1513–1520.

"A New Scalable Floating–Gate EEPROM Cell" (Chang et al.), Solid State Electronics, vol. 35, No. 10, 1992, pp. 1521–1528.

* cited by examiner

*Primary Examiner*—David Hardy
(74) *Attorney, Agent, or Firm*—Herbert L. Lerner; Laurence A. Greenberg; Werner H. Stemer

(57) ABSTRACT

The component has a channel zone and an oppositely doped zone in a semiconductor substrate. The channel zone and a peripheral region of the first doped zone are separated by a gate dielectric from an overlying channel gate electrode. The first doped zone is predominantly separated by a tunnel dielectric from an overlying tunnel gate electrode. When a suitable voltage is applied to the first doped zone, the tunnel current from the tunnel gate electrode generates an avalanche breakdown in the semiconductor substrate. A current results between the terminals of the channel zone and the first doped zones that is amplified by several orders of magnitude.

9 Claims, 5 Drawing Sheets

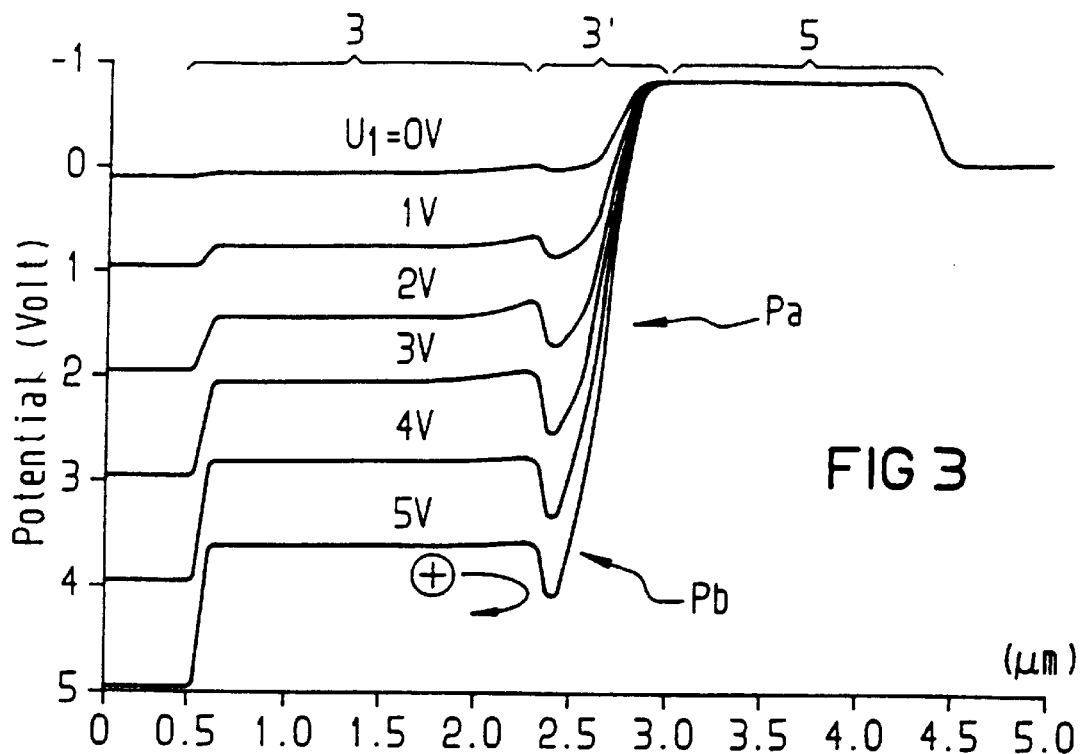
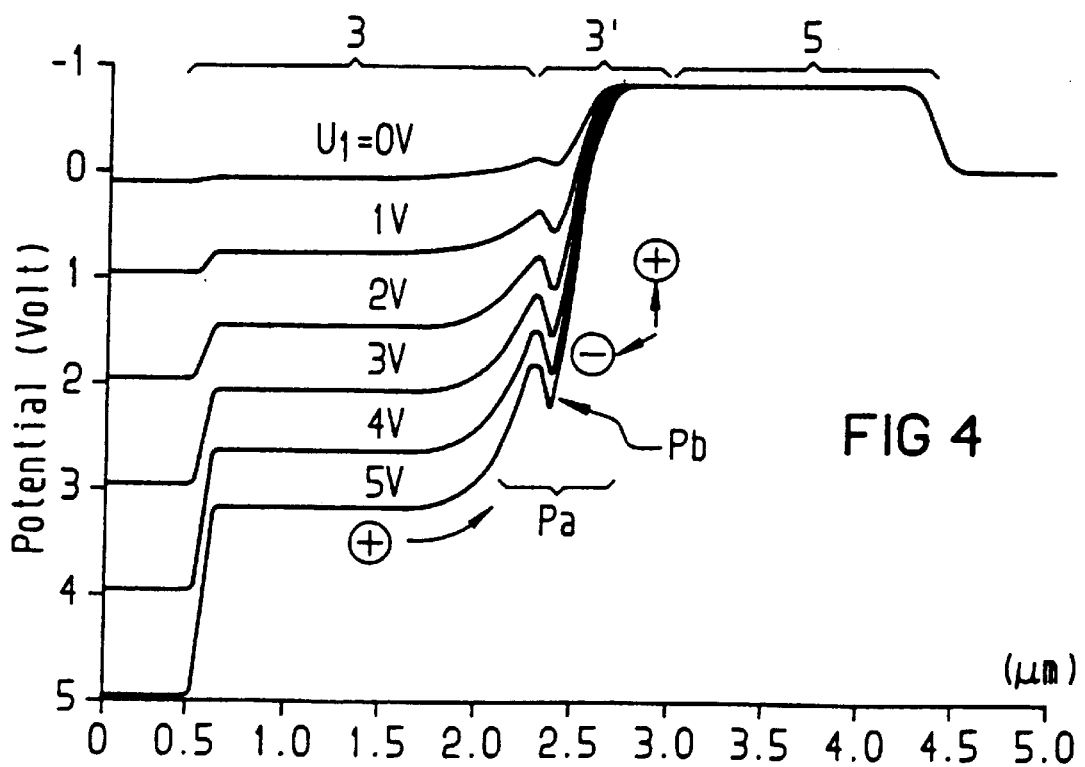

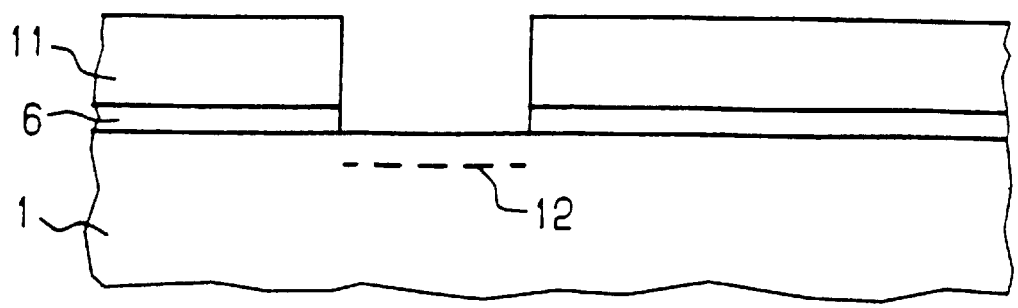
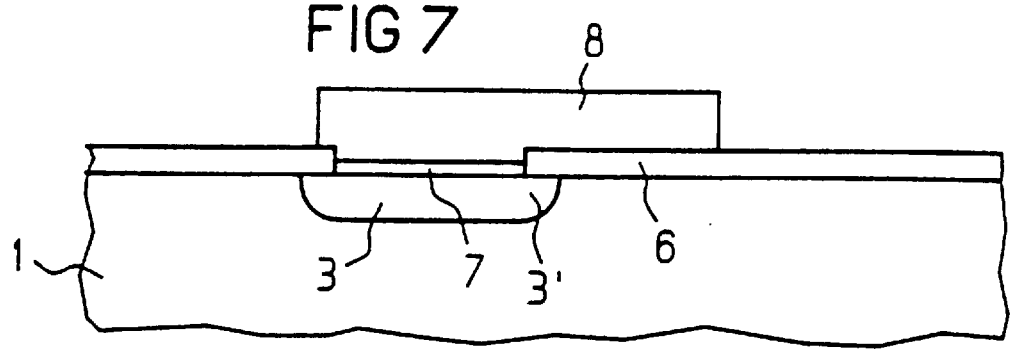
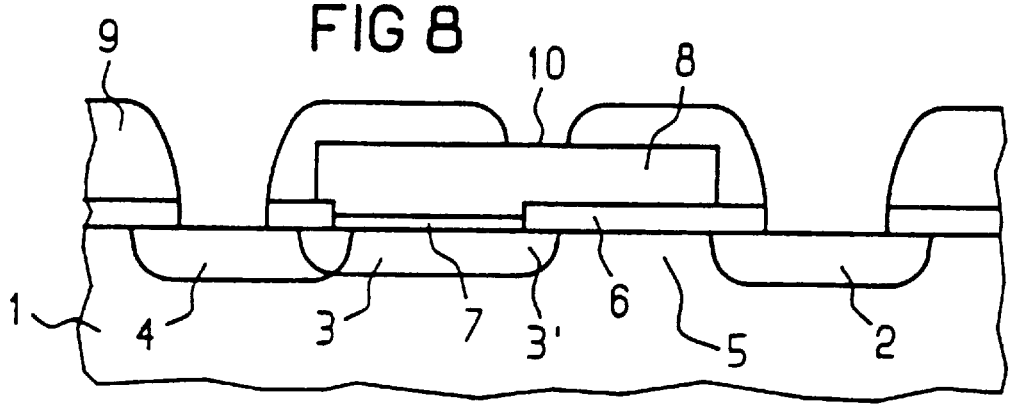

SEMICONDUCTOR COMPONENT WITH ADJUSTABLE CURRENT AMPLIFICATION BASED ON A TUNNEL-CURRENT-CONTROLLED AVALANCHE BREAKDOWN

CROSS-REFERENCE TO RELATED APPLICATION

This is a continuation of copending international application PCT/DE97/00595, filed Mar. 24, 1997, which designated the United States.

BACKGROUND OF THE INVENTION

1. Field of the Invention

The invention lies in the semiconductor field. More specifically, the invention relates to a semiconductor component with a first doped zone of a second conductivity type disposed in a semiconductor substrate of the first conductivity type, and a channel zone in the semiconductor substrate disposed adjacent to the first doped zone.

In integrated semiconductor circuits, bipolar transistors are usually used for current amplification. Because they have a plurality of doped zones each with their own terminal, the space required is relatively great.

SUMMARY OF THE INVENTION

It is accordingly an object of the invention to provide a semiconductor component with adjustable current amplification based on a tunnel current controlled avalanche breakdown, which overcomes the above-mentioned disadvantages of the heretofore-known devices and methods of this general type and which allows very high current amplification while requiring little space.

With the foregoing and other objects in view there is provided, in accordance with the invention, a semiconductor component, comprising:

a semiconductor substrate of a first conductivity type;

a first doped zone of a second conductivity type disposed in the semiconductor substrate, the first doped zone having a surface, a peripheral region, and a terminal;

a channel zone of the first conductivity type disposed in the semiconductor substrate adjacent the first doped zone, the channel zone having a surface and a terminal;

a tunnel dielectric partly covering the surface of the first doped zone;

a gate dielectric covering the surface of the channel zone and the peripheral region of the first doped zone;

an insulation layer disposed on the peripheral region and being formed at least in part by the gate dielectric, the insulation layer having a greater layer thickness than the tunnel dielectric;

a tunnel gate electrode on the tunnel dielectric; and a channel gate electrode on the gate dielectric;

wherein the first doped zone is connectible to a first potential and the channel zone is connectible to a second potential, such that a current flows between the first doped zone and the channel zone that is amplified relative to a current flowing through the tunnel dielectric by a given amplification factor, and wherein the given amplification factor is adjustable by a parameter selected from the group consisting of a thickness of the tunnel dielectric, a thickness of the gate dielectric, a thickness of the insulation layer, a dopant concentration of the first doped zone, a dopant concentration of the channel zone, and a size of the peripheral region.

In other words, the invention involves a semiconductor component that is based on a tunnel-current-controlled avalanche breakdown. The component has a first doped zone of a second conductivity type in a semiconductor substrate of a first conductivity type. A zone in the semiconductor substrate adjacent the first doped zone acts as a channel zone. The first doped zone is partly covered by a thin tunnel dielectric, and both the channel zone and a predetermined peripheral region of the first doped zone, which region adjoins the channel zone, are covered by a gate dielectric. A tunnel gate electrode is disposed on the tunnel dielectric, and a channel gate electrode is disposed on the gate dielectric. The channel gate electrode accordingly overlaps the predetermined peripheral region of the first doped zone. Both the first doped zone and the channel zone are connectable.

In accordance with an added feature of the invention, the gate dielectric is thicker than the tunnel dielectric. If a component with especially high current amplification is to be made, then both dielectrics can have the same thickness. In the embodiment with a common gate electrode, this can mean that a potential barrier, of the kind described in detail hereinafter, will not occur.

In accordance with an additional feature of the invention, the tunnel gate electrode and/or the channel gate electrode has a gate terminal.

In accordance with another feature of the invention, the tunnel gate electrode and the channel gate electrode are conductively connected to one another to form a common gate electrode.

In accordance with a further feature of the invention, the first conductivity type is a p conductivity type and the second conductivity type is an n conductivity type. In other words, the semiconductor substrate comprises p-conductive silicon and has a $p^+$-doped zone as a terminal for the channel zone. The first doped zone is n-doped and is connectable via a further $n^+$-doped zone.

In accordance with again a further feature of the invention, the first potential is a positive potential applied to the first doped zone, a non-positive potential is applied to the common gate via the gate terminal, and the semiconductor substrate is at ground potential.

In accordance with again an added feature of the invention, the parameters thickness of the tunnel dielectric, thickness of the gate dielectric, and size of the peripheral region of the first doped zone are selected such that at predetermined potentials electrons tunneling through the tunnel dielectric generate an avalanche breakdown to the channel zone.

In accordance with again another feature of the invention, there is provided a control gate disposed above and insulated from the common gate.

In accordance with again a further feature of the invention, a highly doped zone of the first conductivity type is formed in the semiconductor substrate for connecting the channel zone. Further, there is provided a highly doped zone of the second conductivity type in the semiconductor substrate for connecting the first doped zone.

The tunnel gate electrode and the channel gate electrode can be conductively connected to one another and form a common gate electrode, which can be made from the same conducting layer. The common gate can be connectible from outside to a voltage $U_G$, but it can also be a so-called floating gate, similar to that of an EPROM. In the latter case, a control gate above the common gate is preferably provided. If the tunnel gate electrode and the channel gate electrode are insulated from one another, they can be connected to different potentials.

With the above and other objects in view there is also provided, in accordance with the invention, a method of producing a semiconductor component as described above: The production method incorporates the following steps:

forming a gate dielectric on a semiconductor substrate of a first conductivity type;

applying a photoresist mask to the gate dielectric, wherein the mask is formed with an opening defining a region of a tunnel dielectric to be produced;

producing a first doped zone of a second conductivity type below the opening by implanting through the gate dielectric;

removing the gate dielectric from the surface of the first doped zone except for a peripheral region of the first doped zone;

removing the remaining photoresist mask;

forming a tunnel dielectric on the exposed semiconductor substrate surface;

producing a tunnel gate electrode on the tunnel dielectric and a channel gate electrode on a predetermined portion of the gate dielectric; and forming a terminal for a channel zone adjacent the first doped zone and forming a terminal for the semiconductor substrate.

In accordance with a concomitant feature of the invention, the gate dielectric is removed in self-adjusted fashion with respect to the first doped zone. This is effected with the photoresist mask used in the implanting step.

The component can be produced simply and requires little space. Producing the tunnel dielectric in self-adjusted form with respect to the first doped zone is especially advantageous, because by this provision the electrical properties of the component can be adjusted more precisely, and the space requirement is reduced.

Other features which are considered as characteristic for the invention are set forth in the appended claim.

Although the invention is illustrated and described herein as embodied in a semiconductor component with adjustable current amplification based on a tunnel-current-controlled avalanche breakdown, it is nevertheless not intended to be limited to the details shown, since various modifications and structural changes may be made therein without departing from the spirit of the invention and within the scope and range of equivalents of the claim.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagram showing the potential profile along the axis III–III' in FIG. 1;

FIG. 4 is a further diagram showing the potential profile;

FIGS. 6–8 are sections through a semiconductor substrate illustrating the essential sequential steps of the production process;

DESCRIPTION OF THE PREFERRED EMBODIMENTS

Figure 1:
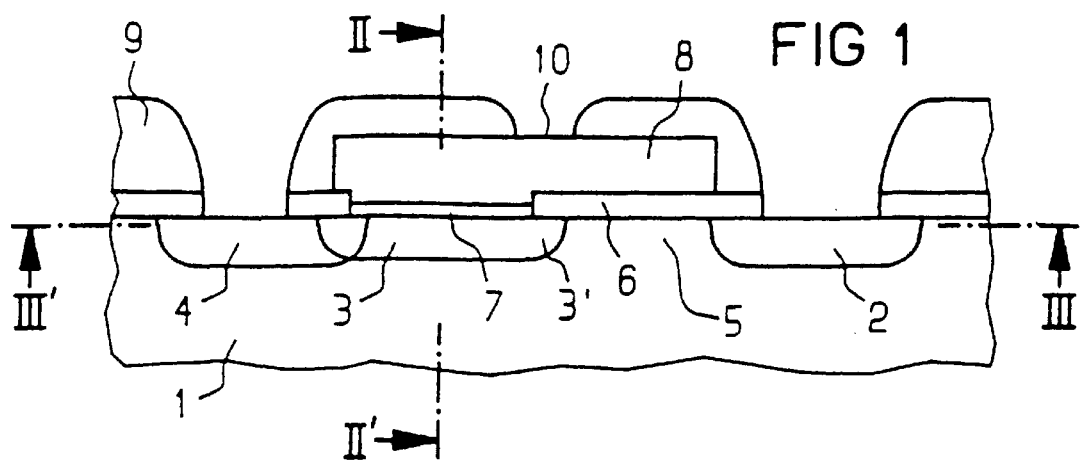
FIG. 1 is a section through a semiconductor substrate with a component.

Referring now to the figures of the drawing in detail and first, particularly, to FIG. 1 thereof, there is seen a semiconductor substrate 1 of a first conductivity type with a highly-doped terminal 2 of the first conductivity type. A first doped zone 3 of a second conductivity type (opposite the first type) with a highly doped terminal 4 of the second conductivity type is formed in the semiconductor substrate 1. The surface of the semiconductor substrate 1 simultaneously forms one surface of each of the doped zones 2, 3, 4. The substrate zone 5 adjacent to the first doped zone 3 is a channel zone 5 and is located between the highly doped terminal zone 2 and the first doped zone 3. A gate dielectric 6 is located on the semiconductor substrate surface and covers the channel zone 5 and the peripheral region 3', oriented toward the channel zone, of the first doped zone 3. The predominant portion of the first doped one is covered by a tunnel dielectric 7, which is thinner than the gate dielectric. The region of the first doped zone 3 covered by the tunnel dielectric is known as a tunnel window. The tunnel dielectric 7 and the gate dielectric 6 are covered in this example by a common gate electrode 8. The assembly is covered with an insulation 9, which has openings for the terminals 2, 4 and 10 (for the semiconductor substrate, the first doped zone, and the gate, respectively).

By way of example, it will now be assumed that the terminal zone 4 on the side of the tunnel window is $n^+$-doped, and the terminal zone 2 on the side of the gate dielectric is $p^+$-doped. The tunnel window is connected through the n-doped zone 3, which extends past the boundary of the tunnel window. The channel zone 5 under the gate dielectric 6 is weakly p-doped in accordance with the substrate doping. It is connected via the highly doped $p^+$-zone 2 on the gate dielectric side of the common gate 8. The connections are as follows:

$U_G$=0 to −5 V at the terminal 10

$U_1$=+5 V at the terminal 4

$U_S$=0 V at the terminal 2.

The common gate 8 is at negative potential relative to the n-doped first zone.

Figure 2:
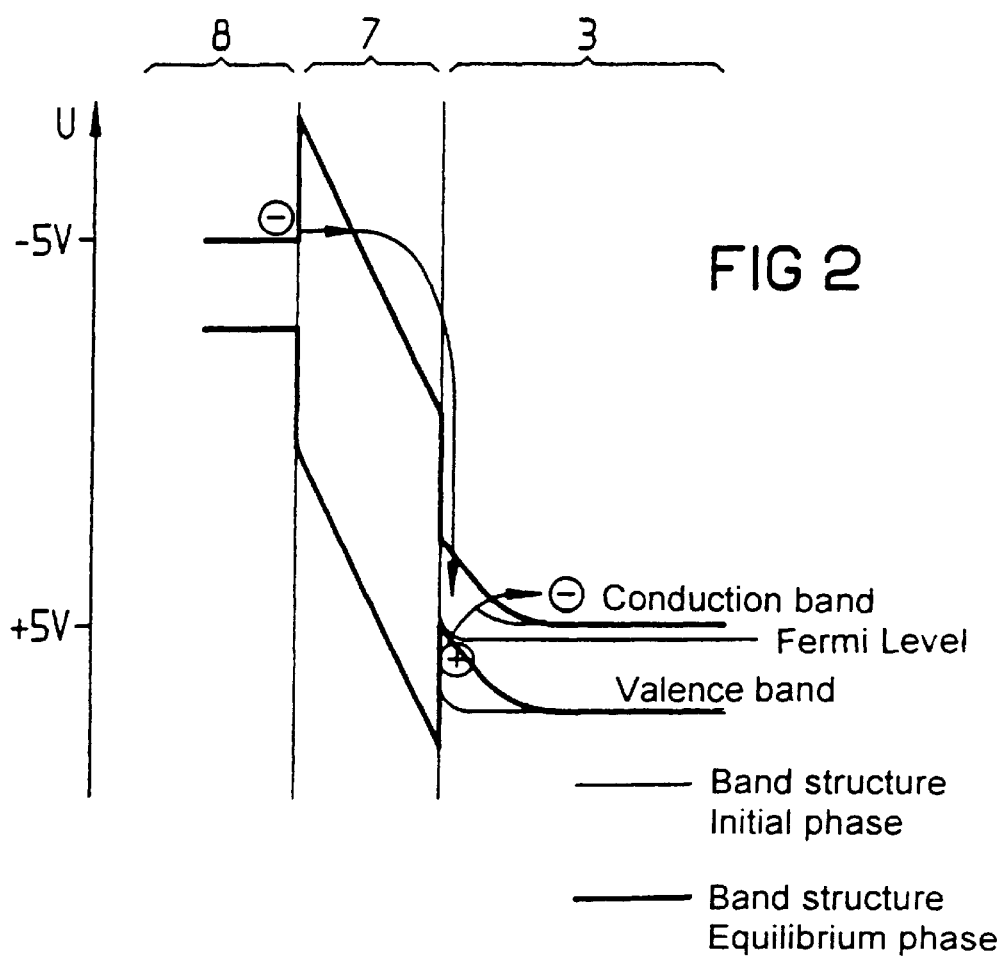
FIG. 2 is a is diagram showing a potential profile along a given direction in the semiconductor substrate.

Referring now to FIG. 2, there is shown the course of potential along the axis, designated II–II' in FIG. 1, in a first approximation. If the potential difference between the common gate 8 and the first doped zone 3 is great enough, electrons can tunnel out of the gate through the potential barrier in the tunnel dielectric 7 into the conduction band of the tunnel dielectric and can then enter the first doped zone 3 (the dashed line in the band diagram of FIG. 2 represents the original potential course). In the process, they absorb enough energy to generate electron-hole pairs – – + in the first doped zone 3. The holes, which increase in number at the boundary face with the tunnel dielectric, bend the bands until a state of quasi-equilibrium is attained (which is represented by the solid line; along the upper edge of the valence band, holes have the tendency to migrate towards the potential that is lower for them. The current from the common gate to the first doped zone is determined by the tunneling operation. The current from the zone 3 to the substrate, and in particular to the channel zone S, is negligible if, in a first approximation, the edge of the tunnel dielectric (boundary of the tunnel window) need not be taken into account, or in other words if a single-dimensional observation along a coordinate axis at right angles to the boundary face is sufficient.

In a real component, the boundary of the tunnel dielectric does have to be taken into account. In the description of the tunneling operation, a two-dimensional observation is necessary. To that end, the course of the potential in the vicinity of the substrate surface along a horizontal axis is observed.

FIG. 3 shows the course of potential for various values of $U_1$ along the boundary face, perpendicularly to the plane of the drawing in FIG. 2, or in other words along the axis designated III–III' in FIG. 1, in a simulation calculation. Since in the ensuing description holes play the decisive role, the term "potential" in each case refers to a potential for holes (that is, the potential decreases from positive to negative voltage values). The case shown is that of a large peripheral region of the first doped zone. The peripheral region 3' is by definition the portion of the first doped zone 3 that is adjacent to the channel zone 5 and covered by the gate dielectric 6. The pn junction between the first (n-doped) doped zone 3 and the (p-doped) channel zone 5 or substrate is polarized in the depletion direction. This leads to a pronounced potential gradient. At the transition from the tunnel dielectric to the gate dielectric, if $U_1>0$, a low potential barrier Pb for holes still develops both in the conduction band and the valence band, since the potential at the boundary face depends on the oxide thickness. The potential in the first doped zone 3 under the tunnel dielectric 7 is lower, for the same dopant concentration for holes, than below the gate dielectric. The potential drop Pa to the p zone does not ensue until the concentration drop in the doping. Holes +, which have been created by injecting high-energy electrons through the tunnel dielectric in the first doped zone, are thus unable to leave the first doped zone and instead are reflected at the potential barrier. For describing the tunneling operation, the observation already made in conjunction with FIG. 2 suffices.

In FIG. 4, the course of potential corresponding to FIG. 3 is shown in the case of a smaller peripheral region 3'. The potential drop Pa to the p-zone ensues earlier. The potential barrier Pb drops in the descending branch and is thus below the potential in the first doped zone. The hole is created by tunnel electrons can—in contrast to the situation in FIG. 3—escape from the first doped zone and pass through the potential gradient to reach the channel zone. By impact ionization, this creates further electronhole pairs − − +. The result is charge multiplication, so that the current from the first doped zone 3 to the channel zone 5 is many orders of magnitude (approximately $10^4$ to $10^6$) higher than the tunnel current. Accordingly, the state of quasi-equilibrium is never attained, since the holes +escape laterally and thus do not lead to band bending. The amplification factor can be adjusted by means of the ratio in thickness of the tunnel dielectric to the gate dielectric (variation of the potential barrier), the dopings in the first doped zone and the channel zone, and the overlap of the gate dielectric over the first doped zone, that is, by means of the size of the peripheral region 3'. For instance, a thicker gate dielectric raises the potential barrier Pb. High doping of the first zone on the one hand increases lateral out-diffusion and on the other hand lowers the potential barrier Pb.

Figure 5A:
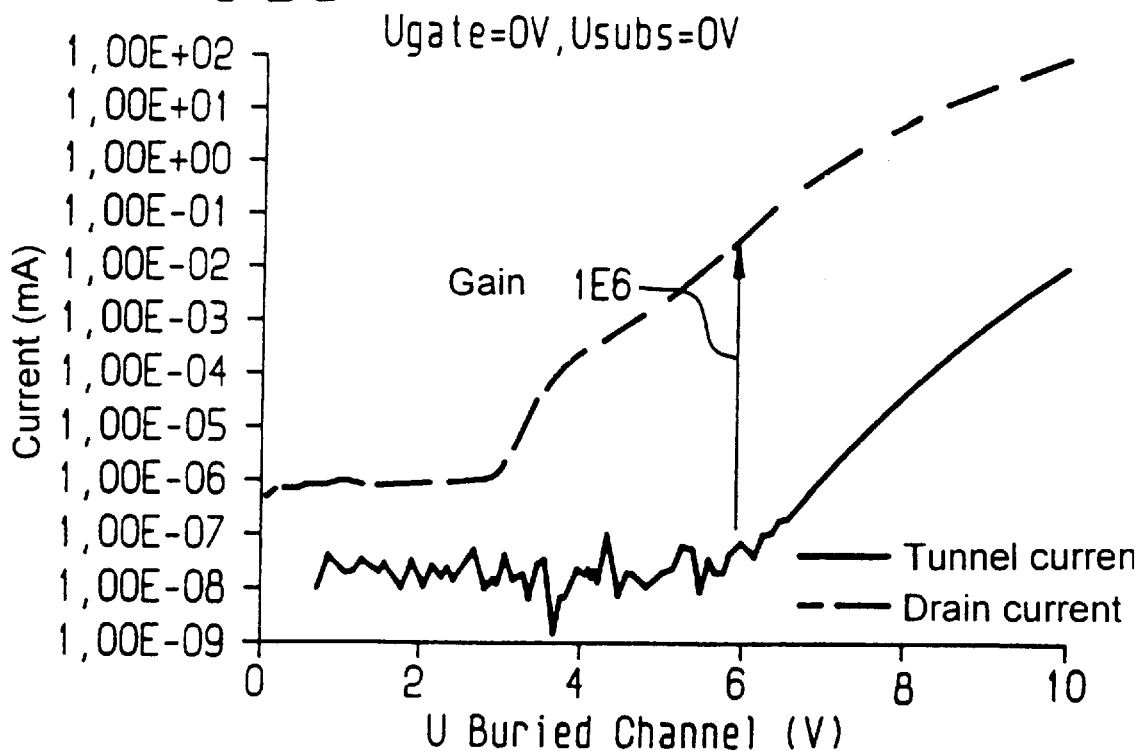
FIGS. 5a and 5b are diagrams showing the tunnel current and the amplified drain current for various voltages at the gate.
Figure 5B:
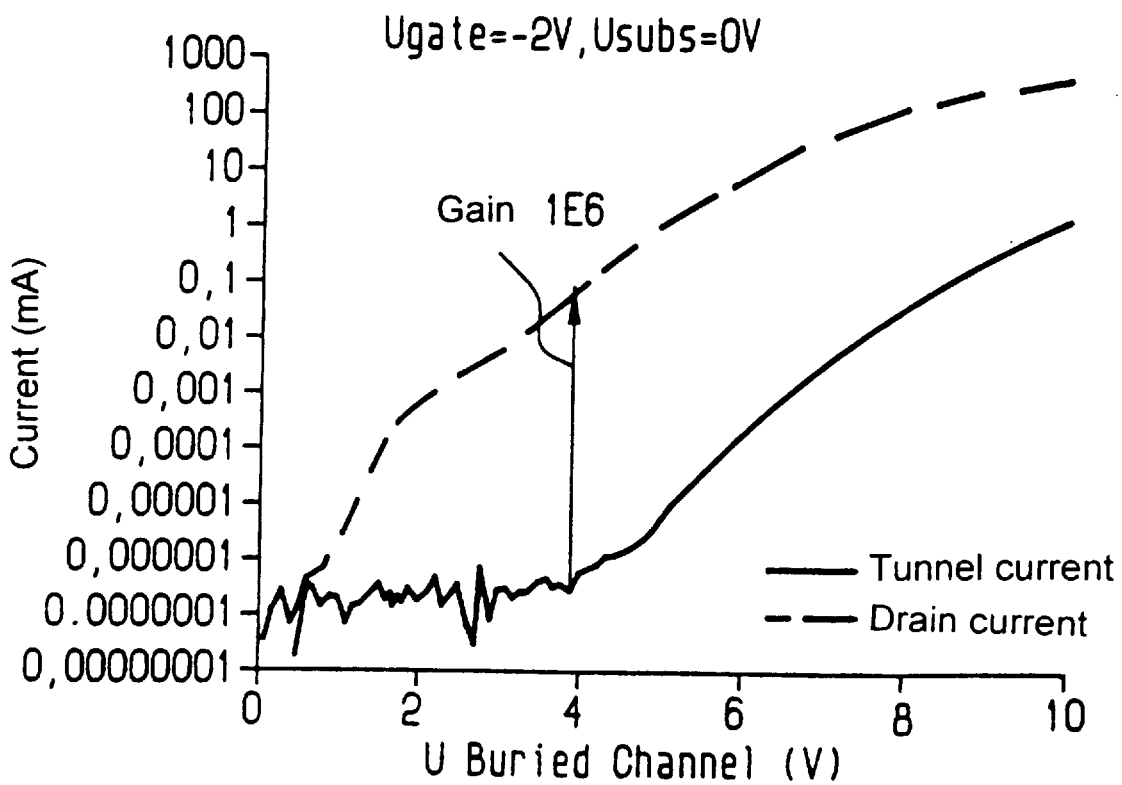

FIG. 5, in dimensional terms, shows the so-called drain current between the terminals 2 and 4, that is, between the first doped zone and the substrate, and the tunnel current between the terminals 10 and 4, as a function of the potential at the terminal 4. The values selected in FIG. 5a are $U_G=0$ V and $U_S=0$ V, and in FIG. 5b $U_G=-2$ V and $U_S=0$ V. It can be seen that the avalanche breakdown begins at approximately 6 V and 4 V, respectively, and the amplification factor between the tunnel current and the drain current amounts to from $10^6$ to $10^4$.

Referring now to the sequential drawing FIGS. 6 to 8, it is shown that the component of FIG. 1 can be produced in a simple way. To that end, on a p-doped silicon substrate 1, a gate dielectric 6, for instance a silicon oxide 25 nm in thickness, is applied over the entire surface by known methods. Over that, a photoresist mask 11 is created, which has an opening at the place where the first doped zone is to be created. Through this opening, phosphorous ions 12 are then implanted in the substrate, with the gate dielectric acting as stray oxide.

Next, preferably using the same photoresist mask 11, the gate dielectric is structured, so that it has an opening above the implanted zone. The edge of the gate dielectric 6 and of the first doped zone are then self-adjusted to one another, and the size of the peripheral region 3', which size determines the electrical properties, can then be adjusted precisely.

With reference to FIG. 7, the mask 11 is detached, and a thin tunnel dielectric 7 is created on the exposed substrate surface. To that end, using an RTP (rapid thermal annealing) process, a nitrided oxide approximately 8 nm thick is grown. At the same time the preceding implantation is cured by the incident temperatures of 1000 to 1150° C. The out-diffusion in the substrate that occurs in the process causes the first doped zone 3 to extend past the tunnel window boundary to beneath the gate dielectric 6. By a suitable choice of the parameters, a predetermined peripheral region 3' that is located beneath the gate dielectric can be established. The RTP process is the essential step that by its thermal load on the substrate determines the size of the first doped zone 3. Next, a polysilicon layer is applied over the entire surface and structured to form the common gate electrode 8. This gate electrode 8 covers both the tunnel window and a region, adjoining the tunnel widow, of the gate dielectric 6.

Referring now to FIG. 8, conventional methods are employed to next form an insulating layer 9 on the gate electrode which covers the gate electrode on all sides. This insulating layer 9 has openings above the terminals 2, 4 and 10.

Figure 9:
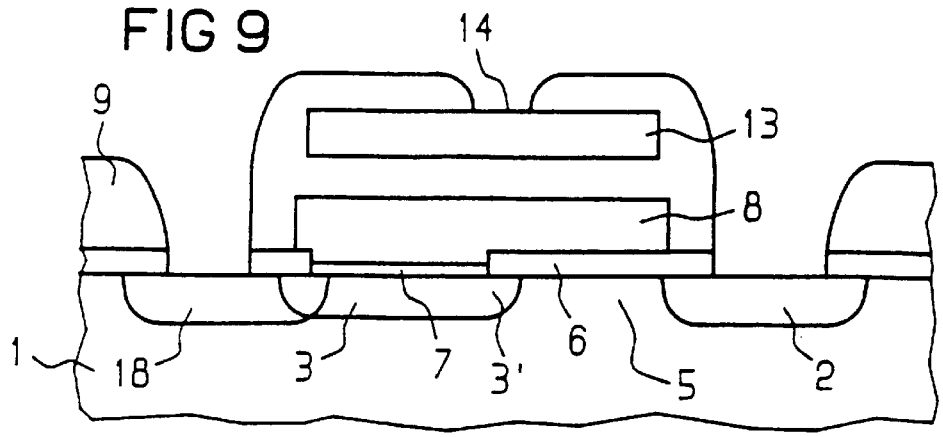
FIGS. 9–11 are sectional views illustrating further features of the semiconductor component.

As illustrated in FIG. 9, the component can be used as a component of a EEPROM cell. The common gate 8 is insulated in this case (floating gate), and a control gate 13 is disposed above it. The control gate has a terminal 14.

Such a configuration can be used as an analog memory or as an analog/digital converter. An analog signal is for instance stored in memory by applying a voltage $U_{SG}$ ($U_1=0$ V, $U_S=0$ V) proportional to the signal to the control gate 13 via its terminal 14. The charge tunneling out of the first doped zone 3 into the floating gate 8 is stored permanently. It is a measure of the voltage applied. Upon readout, $U_1$ at terminal 4 is set at approximately 8 V ($U_S=0$ V, $U_{SG}=0$ V). Electrons tunnel out of the floating gate into the first doped zone 3 and set the charge multiplication into operation, which does not stop until no further electrons tunnel out of the gate 8. The thus-increased charge quantity can easily be measured.

For use as a component of a EEPROM cell, the first doped zone 3 is implanted through the tunnel window mask 11. The dose and the temperature budget in the RTP process are selected such that this doping diffuses out via the tunnel window far enough (that is, far enough under the gate dielectric) that the amplification factor becomes less than 10. For programming, $U_1=15$ V is applied to the terminal 4, so that electrons tunnel out of the floating gate 8 ($U_S=0$, $U_{SG}=0$)

The charge multiplication is so slight that even a small-sized charge pump is capable of maintaining the programmed voltage.

Figure 10:
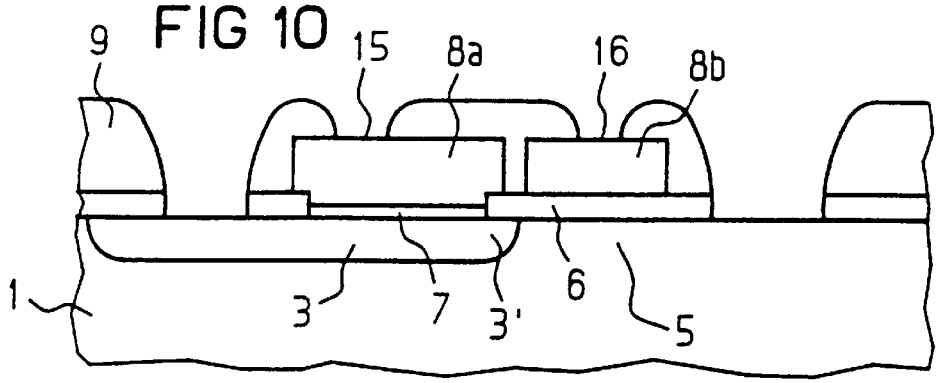

In the embodiment of FIG. 10, the tunnel gate electrode 8a and the channel gate electrode 8b are insulated from one another. The two electrodes can each have a respective terminal 15, 16 and be connected to different potentials. The highly-doped terminal zones 2, 4 have been omitted. Instead, the first zone 3 is dimensioned such that it is connectable from outside. This can be attained for instance by providing that the implantation for the first doped zone and the etching of the gate dielectric are done with different masks. The insulation of the two gate electrodes from one another can be done for instance with the aid of a spacer. The two gate electrodes can be made from the same or different conductive layers.

The advantage of this arrangement is that it is possible by varying the voltages at the terminals 8a and 8b, the potential barrier can be varied and thus the amplification factor can be adjusted in a targeted way solely via the gate potentials.

Figure 11:
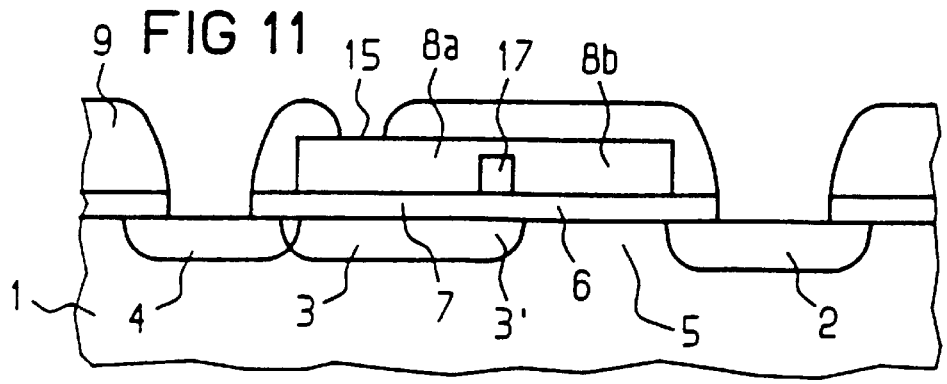

With reference to FIG. 11, the insulation 17 between the tunnel gate electrode 8a and the channel gate electrode 8b creates a potential barrier. Thus the gate dielectric and the tunnel dielectric can be made of equal thickness, without having the dispense with the potential barrier. The insulation 17 acts as a virtual local increase in the gate oxide thickness. Such an arrangement with the gate dielectric and tunnel dielectric of the same thickness is shown in the drawing; the gate dielectric and tunnel dielectric are short-circuited at their upper edge. Such an arrangement can be used as described above, for instance in EEPROMs. The height and location of the barrier Pb is adjusted via the dimensioning of the insulation 17 and of the gate and tunnel dielectrics. Additional information may be had, in this regard, from my copending application No. published as WO 97/38446, which is herewith incorporated by reference.

What is claimed is:

1. A semiconductor component, comprising:

a semiconductor substrate of a first conductivity type;

a first doped zone of a second conductivity type disposed in said semiconductor substrate, said first doped zone having a surface, a peripheral region, and a terminal;

a channel zone of the first conductivity type disposed in said semiconductor substrate adjacent said first doped zone, said channel zone having a surface and a terminal, said terminal having a highly doped zone of said first conductivity type in said semiconductor substrate;

a tunnel dielectric partly covering said surface of said first doped zone, said tunnel dielectric having a thickness;

a gate dielectric covering said surface of said channel zone and having a thickness;

a dielectric disposed on said peripheral region of said first doped zone and being formed at least in part by said gate dielectric, said dielectric disposed on said peripheral region having a layer thickness greater than said thickness of said tunnel dielectric;

a tunnel gate electrode on said tunnel dielectric; and a channel gate electrode on said gate dielectric;

wherein said first doped zone is to be connected to a first potential and said channel zone is to be connected to a second potential, such that a current flows within said first doped zone and said channel zone, said current within said first doped zone and said channel zone being amplified relative to a current flowing through said tunnel dielectric by a given amplification factor, and wherein said given amplification factor is adjustable by a parameter selected from the group consisting of said thickness of said tunnel dielectric, said thickness of said gate dielectric, a dopant concentration of said first doped zone, a dopant concentration of said channel zone, and a size of said peripheral region.

2. The semiconductor component according to claim 1, wherein said gate dielectric is thicker than said tunnel dielectric.

3. The semiconductor component according to claim 1, wherein at least one of said tunnel gate electrode and said channel gate electrode has a gate terminal.

4. The semiconductor component according to claim 1, wherein said tunnel gate electrode and said channel gate electrode are conductively connected to one another to form a common gate electrode.

5. The semiconductor component according to claim 1, wherein said first conductivity type is a p conductivity type and said second conductivity type is an n conductivity type.

6. The semiconductor component according to claim 5, wherein said first potential is a positive potential applied to said first doped zone, a non-positive potential is applied to said common gate via said gate terminal, and said semiconductor substrate is at ground potential.

7. The semiconductor component according to claim 1, wherein said parameters selected from the group consisting of the thickness of said tunnel dielectric, the thickness of said gate dielectric, and the size of said peripheral region of said first doped zone are selected such that at predetermined potentials electrons tunneling through said tunnel dielectric generate an avalanche breakdown to said channel zone.

8. The semiconductor component according to claim 1, wherein said tunnel gate electrode and said channel gate electrode together form a common gate electrode, and including a control gate disposed above and insulated from said common gate.

9. The semiconductor component according to claim 1, which further comprises a highly doped zone of the second conductivity type in said semiconductor substrate for connecting said first doped zone.

* * * * *